United States Patent
Bagga

(10) Patent No.: US 11,206,006 B2
(45) Date of Patent: Dec. 21, 2021

(54) TRIFILAR TRANSFORMER AND NOTCH FILTERS

(71) Applicant: Novelda AS, Kviteseid (NO)

(72) Inventor: Sumit Bagga, Kviteseid (NO)

(73) Assignee: Novelda AS, Kviteseid (NO)

( * ) Notice: Subject to any disclaimer, the term of this patent is extended or adjusted under 35 U.S.C. 154(b) by 0 days.

(21) Appl. No.: 16/604,470

(22) PCT Filed: Apr. 11, 2018

(86) PCT No.: PCT/EP2018/059275
§ 371 (c)(1),
(2) Date: Oct. 10, 2019

(87) PCT Pub. No.: WO2018/189234
PCT Pub. Date: Oct. 18, 2018

(65) Prior Publication Data
US 2020/0266792 A1    Aug. 20, 2020

(30) Foreign Application Priority Data

Apr. 12, 2017   (GB) .................................... 1705913

(51) Int. Cl.
*H03H 7/01*    (2006.01)
*H03H 7/09*    (2006.01)
*H01F 27/28*   (2006.01)

(52) U.S. Cl.
CPC ....... *H03H 7/0115* (2013.01); *H01F 27/2804* (2013.01); *H03H 7/09* (2013.01);
(Continued)

(58) Field of Classification Search
CPC ............ H03H 7/427; H03H 3/00; H03H 7/09; H03H 2007/013; H01P 11/007
(Continued)

(56) References Cited

U.S. PATENT DOCUMENTS 2,561,087 A    7/1951 Anderson
2008/0094153 A1    4/2008 Wang et al.
(Continued)

FOREIGN PATENT DOCUMENTS

CN    102084439 A    6/2011
CN    104584152 A    4/2015
(Continued)

OTHER PUBLICATIONS

Chen et al., "A Compact and Embedded Balanced Bandpass Filter With Sideband Common-Mode Suppression on Wireless SiP," *IEEE Transactions on Components, Packaging, and Manufacturing Technology*, Jun. 2012, vol. 2, pp. 1030-1038.
(Continued)

*Primary Examiner* — Rakesh B Patel
(74) *Attorney, Agent, or Firm* — Klarquist Sparkman, LLP

(57) ABSTRACT

A trifilar transformer comprising: a first winding; a second winding; and a third winding, wherein one winding is mutually coupled to each of the other two windings, and wherein said other two windings are substantially not coupled to each other. At least one of the first winding, the second winding and the third winding may comprise a figure-of-eight winding, e.g. a clockwise loop and an anti-clockwise loop. In some embodiments, the trifilar transformer may comprise: a first winding; a second winding concentric or interwound with the first winding; and a third winding formed from a first winding part in series with a second winding part, the first winding part having a shape corresponding to the first winding and the second winding part having a shape corresponding to the second winding.

25 Claims, 13 Drawing Sheets

(52) U.S. Cl.
CPC ............... *H01F 2027/2809* (2013.01); *H03H 2007/013* (2013.01)

(58) Field of Classification Search
USPC .................................................. 333/177, 176
See application file for complete search history.

(56) References Cited

U.S. PATENT DOCUMENTS

| | | |
|---|---|---|
| 2012/0206060 A1 | 8/2012 | Beyer et al. |
| 2012/0244802 A1 | 9/2012 | Feng et al. |
| 2014/0077919 A1 | 3/2014 | Godoy et al. |
| 2014/0140443 A1 | 5/2014 | Horng et al. |
| 2015/0162888 A1 | 6/2015 | Yunoki et al. |
| 2015/0214915 A1* | 7/2015 | Yosui .................. H03H 7/1725 333/181 |
| 2015/0364242 A1 | 12/2015 | Aboush et al. |
| 2016/0065166 A1 | 3/2016 | Kihara et al. |
| 2016/0072443 A1 | 3/2016 | Mizokami |
| 2016/0112015 A1 | 4/2016 | Chen et al. |
| 2016/0211823 A1 | 7/2016 | Klemens |

FOREIGN PATENT DOCUMENTS

| | | |
|---|---|---|
| CN | 104737448 A | 6/2015 |
| CN | 104769687 A | 7/2015 |
| CN | 106205971 A | 12/2016 |
| EP | 2863429 | 4/2015 |
| JP | 2005136516 | 5/2005 |
| WO | WO 2012/085670 A1 | 6/2012 |

OTHER PUBLICATIONS

International Search Report and Written Opinion for PCT/EP2018/059275, dated Sep. 10, 2018, 22 pages.
Search Report under Section 17(6) for Application No. GB1705913.0, dated Nov. 29, 2017, 3 pages.
Search Report under Section 17(5) for Application No. GB1705913.0, dated Oct. 11, 2017, 6 pages.
Su et al., "Transmission line metamaterials based on pairs of coupled split ring resonators (SRRs) and complementary split ring resonators (CSRR)," *2015 International Conference on Electromagnetics in Advanced Applications (ICEA) IEEE*, pp. 891-894, ISBN 978-1-4799-7806-9.
English Translation of First Notification of Office Action for China Application No. 201880025141.5, dated Jan. 21, 2021, 10 pages.

* cited by examiner

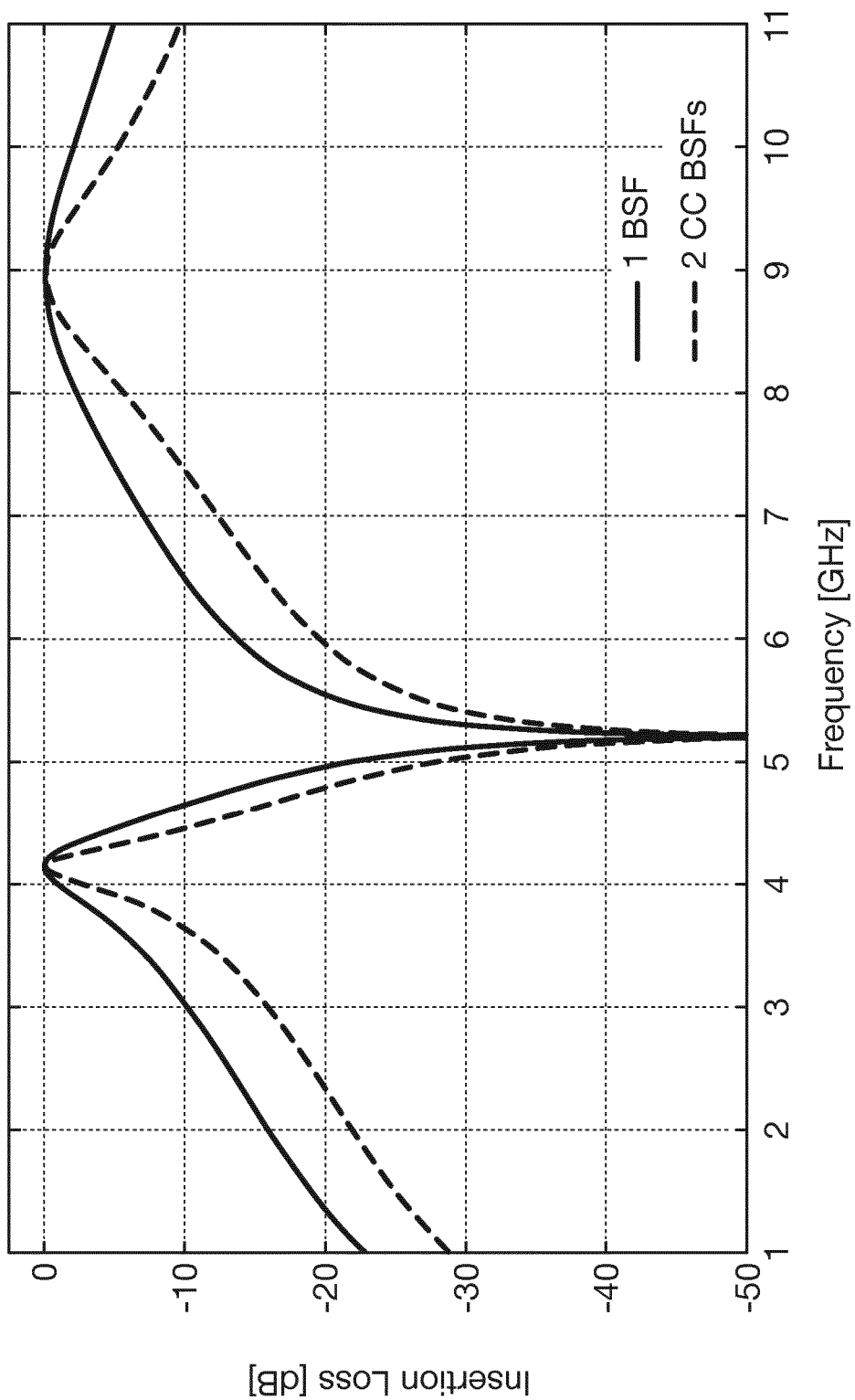

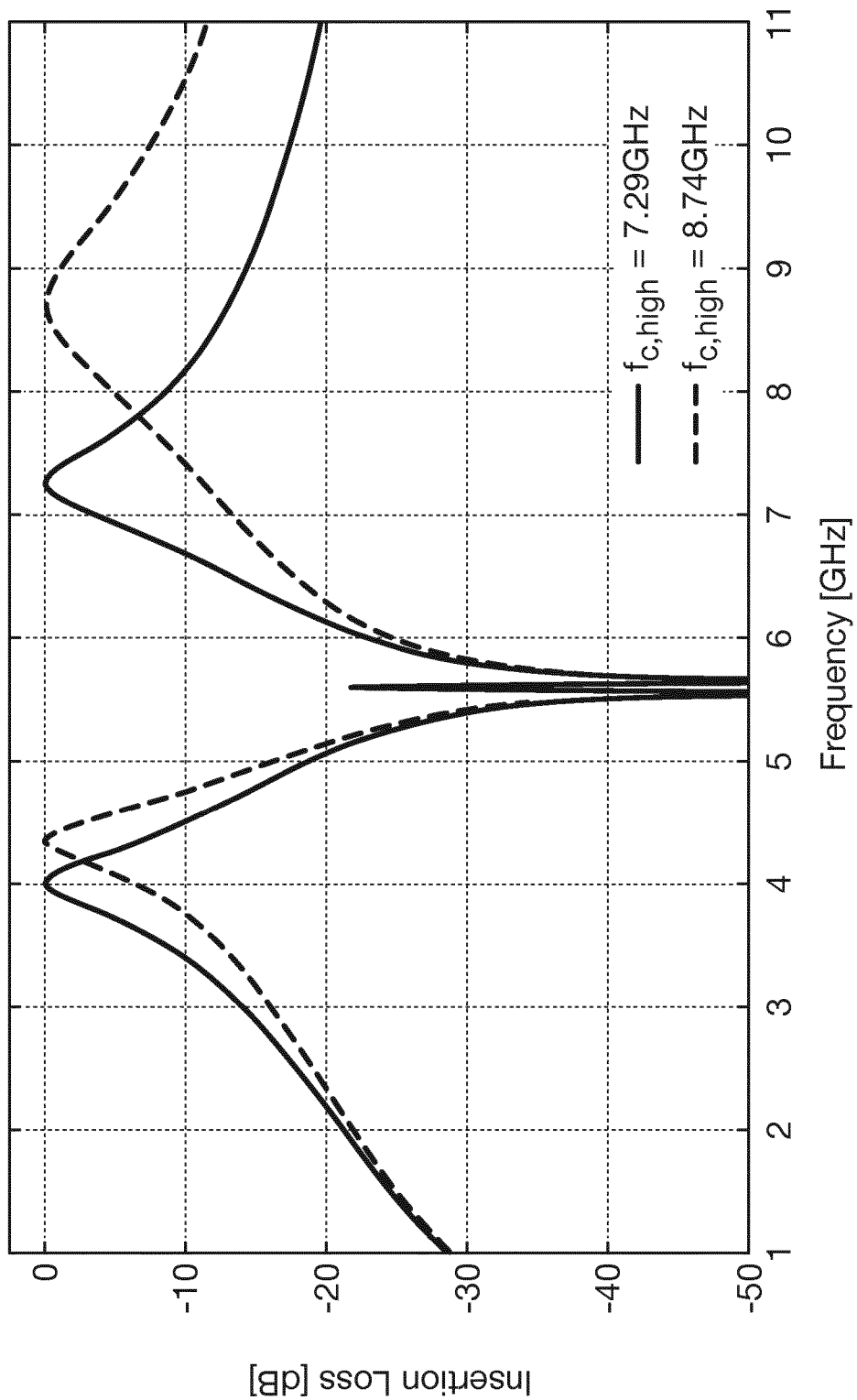

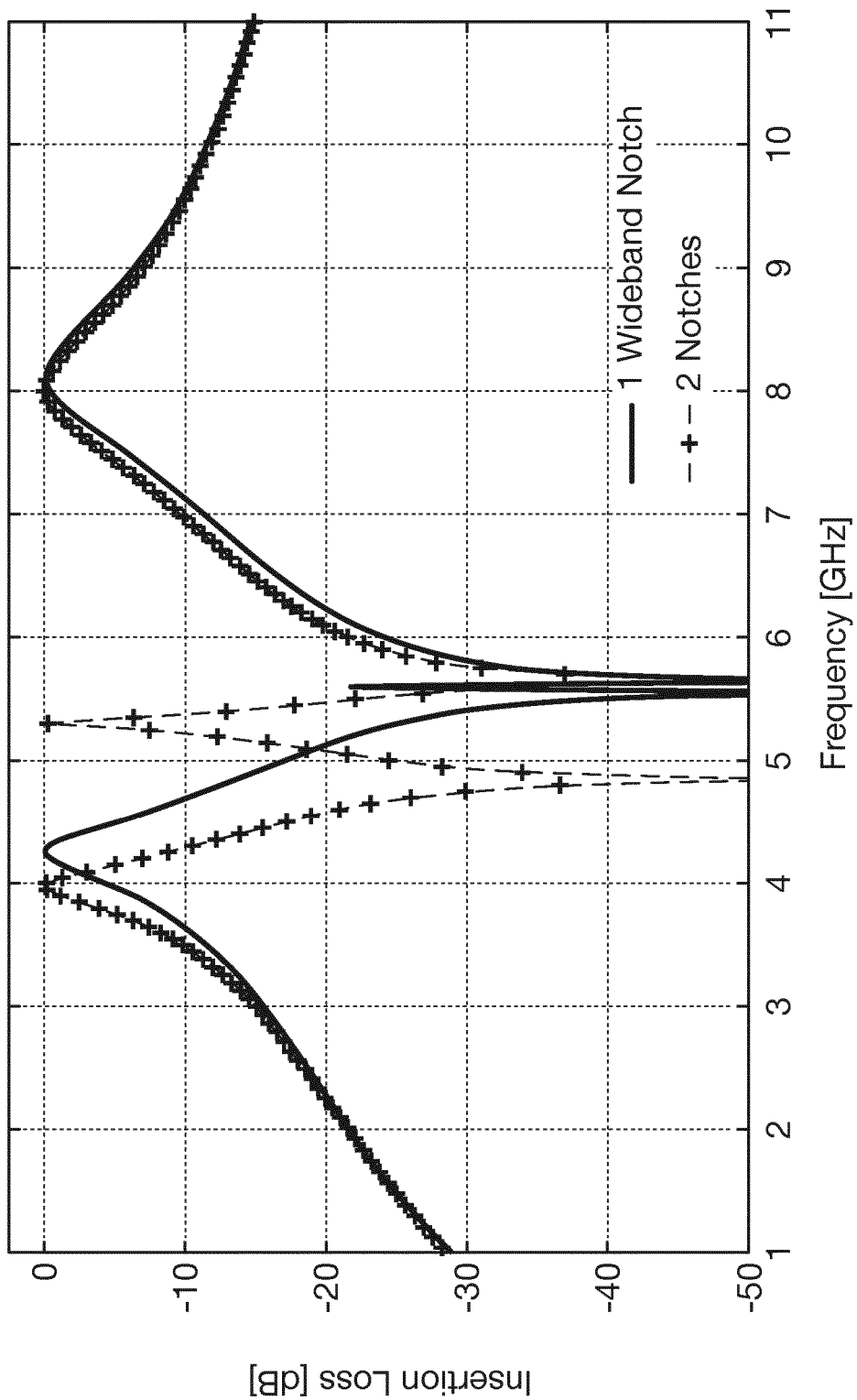

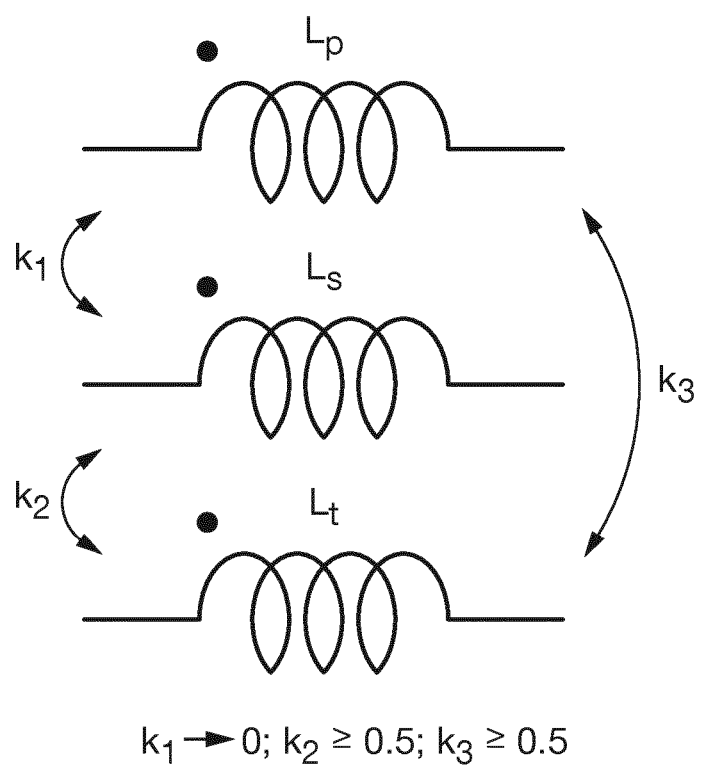

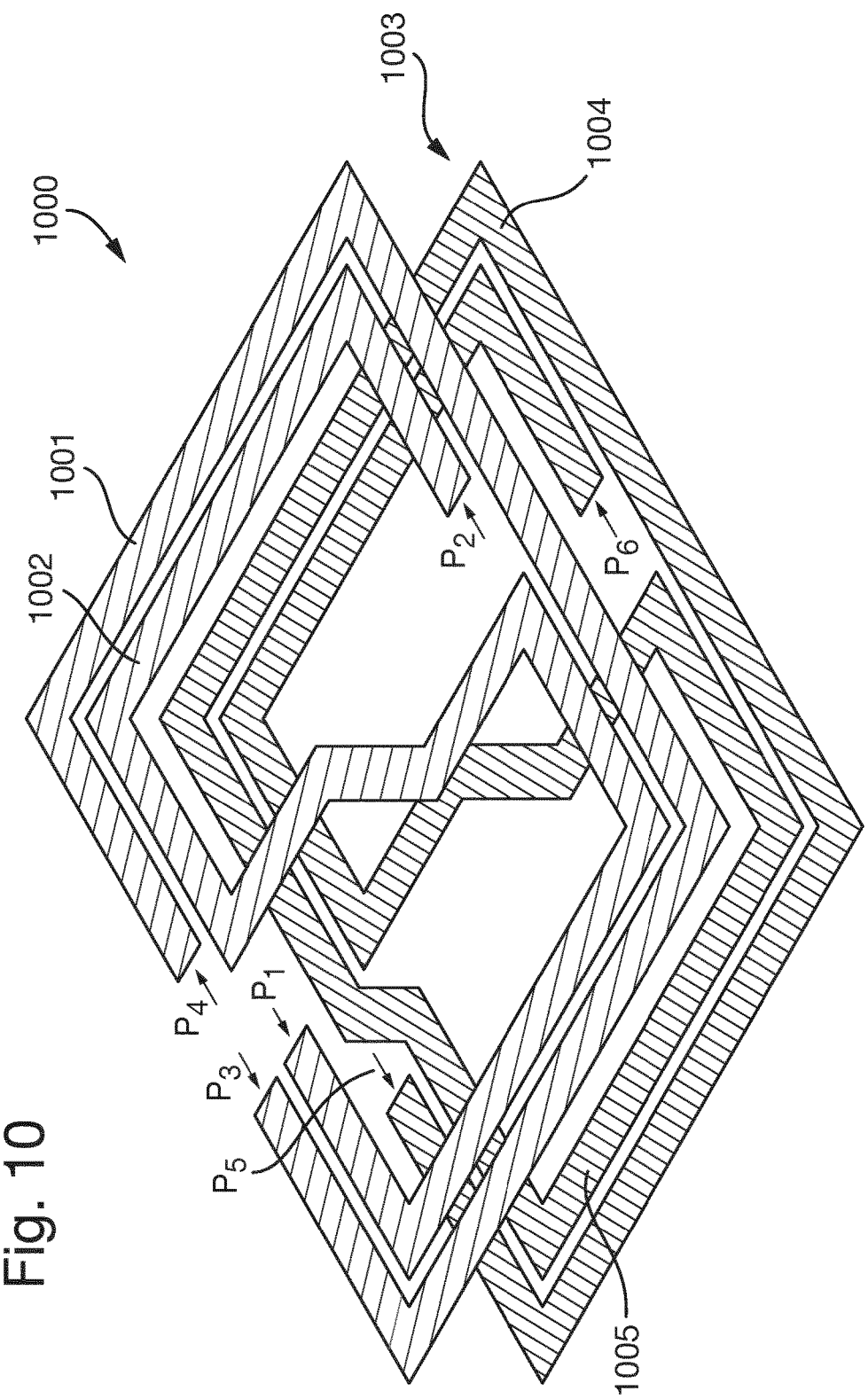

TRIFILAR TRANSFORMER AND NOTCH FILTERS

CROSS REFERENCE TO RELATED APPLICATIONS

This is the U.S. National Stage of International Application No. PCT/EP2018/059275, filed Apr. 11, 2018, which was published in English under PCT Article 21(2), which in turn claims the benefit of Great Britain Application No. 1705913.0, filed Apr. 12, 2017.

The invention relates to filters, in particular band-stop or notch filters with a wideband notch or signal rejection band and to a trifilar transformer.

Band-stop filters are particularly useful in radio receivers to improve robustness, efficiency and co-existence between wireless systems. With larger numbers of devices operating in any given area, the ability to reject signals in adjacent regions of spectrum becomes particularly important. For example, there is typically a lot of signal traffic in the ISM radio bands around 2.4 GHz and 5 GHz which can cause interference with technologies sharing or using adjacent areas of spectrum, if it is not adequately filtered out. Ultra-wideband (UWB) technologies make use of wide regions of spectrum, while ensuring that transmission power is kept below regulation levels across the permitted bands. For example, in the US, the FCC allows transmission across the 3.1 GHz to 10.6 GHz band at a power of less than −41.3 dBm/MHz. In Europe, the corresponding bands are 3.4 GHz to 4.8 GHz and 6 GHz to 8.5 GHz. For maximum efficiency, it is preferable to maximise signal reception across all permitted bands while blocking other interfering signals.

Typically, a band-stop filter or notch filter may be formed by combining low-pass and high-pass filters. A passive band-stop filter circuit typically comprises inductive and capacitive components, and thus the die area of a passive filter is important for minimising the cost of fabrication.

According to a first aspect of the invention there is provided a notch filter for a differential signal comprising a positive signal arm and a negative signal arm; wherein the positive signal arm comprises a first inductive element in series with a second inductive element; wherein the negative signal arm comprises a third inductive element in series with a fourth inductive element; wherein a first capacitive element is connected between the positive signal arm and the negative signal arm, from a first node downstream of the first inductive element and upstream of the second inductive element to a second node downstream of the third inductive element and upstream of the fourth inductive element; wherein a second capacitive element is connected between the positive signal arm and the negative signal arm, from a third node downstream of the second inductive element to a fourth node downstream of the fourth inductive element; wherein the downstream end of the first inductive element is connected to the upstream end of the third inductive element; wherein the upstream end of the first inductive element is connected to the downstream end of the third inductive element; and wherein the differential output of the filter is taken from the first node and the second node.

If the output of this arrangement is taken across the second capacitive element (i.e., from the third and fourth nodes), the circuit acts as a low-pass filter. However, with the output instead taken across the first capacitive element (i.e., from the first and second nodes), the circuit acts as a notch filter (exhibiting low-pass and band-pass responses). Cross-coupling applied across the first and third inductive elements, and the output of this configuration being taken across the first capacitive element, means that the circuit acts as a band-stop (or notch) filter with two well-defined passbands (lower and upper) and a wideband notch between said passbands.

Losses occur in the metal layers that form the inductors, and in the silicon substrate that is below the inductors. At lower frequencies, ohmic losses in the metal traces dominate. At higher frequencies, eddy-currents give rise to skin and proximity effects. Thus, a notch filter realized with inductive elements essentially acts as a band-pass filter (upper and lower cut-off frequencies) with a notch formed in its passband. This is in contrast to all-pass notch filters which pass signals at all frequencies other than in the immediate vicinity of the notch.

The signal input (e.g., from an antenna) is applied or received upstream of the first and third inductive elements. The signal is applied or received as a differential signal, with the positive signal part being received upstream of the first inductive element and the negative signal part being received upstream of the third inductive element. The resonance of the second and fourth inductive elements with the second capacitive element determines the frequency of the notch. The first capacitive element determines the frequency profile (center frequency, bandwidth, notch depth and sharpness) of the passbands.

The filter may further comprise a fifth inductive element upstream of the first inductive element, a sixth inductive element upstream of the third inductive element and a third capacitive element connected between the positive signal arm and the negative signal arm, from a fifth node upstream of the first inductive element to a sixth node upstream of the third inductive element. In such arrangements the filter differential input is applied or received upstream of the fifth and sixth inductive elements. The fifth and sixth inductive elements and the third capacitive element increase the filter order (e.g., from a $4^{th}$-order to a $6^{th}$-order filter), in turn improving the overall performance of the filter. It will be appreciated that the invention is not limited to $4^{th}/6^{th}$ order filters. More stages may be concatenated to improve or alter the transfer response of the filter (albeit with higher insertion loss).

The first capacitive element and the second capacitive element may be single components or may be made up of a plurality of components. However, in preferred embodiments the first capacitive element comprises two capacitive elements connected together with a connection to ground between them. Likewise, the second capacitive element may comprise two capacitive elements connected together with a connection to ground between them. Further, the third capacitive element may also comprise two capacitive elements connected together with a connection to ground between them. This arrangement provides an AC ground node at the (horizontal) axis of symmetry, i.e. between the positive signal arm and the negative signal arm. This acts as a reference node for the positive and negative halves of the differential structure.

The fifth and sixth inductive elements and the third capacitive element may be formed with individual components, but in preferred embodiments these may be the intrinsic inductances of the bond wires that connect the input signal to the filter and the intrinsic capacitance of the bond pads, respectively.

While the inductive elements of the filter may take any suitable form and in particular may be individual inductors, in some preferred examples the first inductive element and the third inductive element are mutually coupled to form a first inverting transformer. By using mutual coupling between these inductive elements the effective self-inductance of each winding is increased, and thus the individual windings can be made smaller for any given implementation.

The first and third inductors may be mutually coupled to form the first transformer in any suitable way, e.g., as concentric/overlay/interwound configurations. In some cases the first and third inductive elements may be formed in the same metal layer. This may in some cases involve short hops into an adjacent metal layer (using vias) simply to bridge over the other traces. In such cases, the adjacent metal layer may be relatively thin, while the majority of the length of the winding is in a thick metal layer. However, the first transformer is preferably formed with two metal layers as a stacked (overlay) transformer with the first and third inductive elements in different layers. The stacked arrangement provides the strongest mutual coupling between the windings in the different layers as the windings can be arranged so that all magnetic flux passing through each winding also passes through the other winding. When formed on-chip, stacked transformers generally warrant two thick RF metal layers in the fabrication process in order to achieve moderate to high Q-factors (e.g. 10-20) which adds to the cost. Thick layers are typically at least 0.5 microns thick, more preferably at least 1 micron thick, more preferably still at least 1.5 microns thick and most preferably at least 2 microns thick. These layers will normally be formed at the top of the layer stack so that they are as far from the substrate as possible. Therefore, such implementations may not always be the most convenient, but where the cost is justified for performance or the two layers are required or beneficial for other reasons, then the stacked transformer arrangement provides the best area and performance (e.g., insertion loss) to cost trade-off.

Similarly, the second inductive element and the fourth inductive element are preferably mutually coupled to form a second inverting transformer. Again preferably the second transformer is formed with two metal layers as a stacked transformer with the second inductive element and fourth inductive element in different layers.

In a particularly preferred arrangement the first inductive element and the second inductive element are formed as a figure-of-eight winding series connected to a loop winding; and similarly the third inductive element and the fourth inductive element are formed as a figure-of-eight winding series connected to a loop winding. A loop winding is a traditional coil winding rather than a figure-of-eight shaped winding, although the exact shape of the loop winding may vary, e.g. it may be circular, octagonal or rectangular. The figure-of-eight winding may be an S-shaped winding which comprises a first part wound in one sense and another part wound in the opposite sense, the first part being adjacent to the second part and series connected thereto. Again, this may have a rounded-shape, a squared shape or a hybrid/intermediate shape (e.g. rounded or bevelled corners). For simplicity of construction it is generally preferred that the loop windings surround the figure-of-eight windings. However this need not necessarily be the case. It is possible for the figure-of-eight winding to surround the loop winding, although this does require the use of more cross-overs such as short hops into an adjacent metal layer (using vias). Additionally, it is possible for the loop windings to partially surround (or be partially surrounded by) the figure-of-eight windings. For example, a loop winding may be formed in a substantially C-shape, partially surrounding one half of a figure-of-eight winding. Indeed two C-shapes may be used, one surrounding each half of the figure-of-eight winding, one coupling to the clockwise loop of the figure-of-eight and the other coupling to the anti-clockwise loop of the figure-of-eight. In other embodiments, the figure-of-eight loop may partially surround the loop windings. For example, the clockwise loop of the figure-of-eight winding may surround (and couple with) a loop winding while the anti-clockwise loop of the figure-of-eight winding surrounds (and couples with) another loop winding. In these embodiments the figure-of-eight winding mutually couples to both of the loop windings, but the two loop windings do not couple together.

All four windings (two loop windings and two figure-of-eight windings) may be formed in a single thick metal layer (although this will require extensive use of vias due to the number of cross-overs that are involved) and the couplings between the various windings is not optimal. It is preferred that the first and second inductive elements are formed in a first metal layer and the third and fourth inductive elements are formed in a second metal layer in stacked arrangement with the first and second inductive elements. With this arrangement, the two figure-of-eight windings form a first stacked inverting transformer whose windings are tightly coupled, while the two loop windings form a second stacked inverting transformer whose windings are also tightly coupled. However, within each metal layer, the figure-of-eight winding in that layer is not coupled to the loop winding in that layer as the current flowing within the figure-of-eight winding is in co-current arrangement with the loop winding for half of its length and in counter-current arrangement with the loop winding for the other half of its length such that the couplings of these two halves cancel out (it will be appreciated that the co-current and counter-current lengths are actually slightly less than half the loop in most practical implementations, which may lead to some very weak residual coupling, but this will be near-zero). Accordingly, the first transformer is not coupled (or only extremely weakly coupled) to the second transformer.

The first transformer could be formed from the figure-of-eight windings or from the loop windings, with the second transformer being formed from the other pair of windings. Preferably the first transformer is formed from the figure-of-eight windings. Thus, preferably the first inductive element and the third inductive element are the figure-of-eight windings and wherein the second inductive element and the fourth inductive element are the loop windings. Other factors (such as metal layer thickness, trace width, etc.) being equal, the Q factor of the loop winding (rectangular, circular, octagonal, etc.) has a better Q factor than the figure-of-eight winding and therefore as the second transformer defines the notch depth, for the maximum notch depth, the second transformer should be the loop winding.

As mentioned above, the second capacitive element, in conjunction with the second and fourth inductive elements, sets the notch frequency. Therefore, while for specific applications the second capacitive element may be a fixed value capacitor, in some preferred embodiments the second capacitive element has an adjustable capacitance. This variability allows for tuning of the notch frequency. Tuning may be used either to vary the notch frequency according to a desired use, or it may be used as part of a calibration process to compensate for variations due to manufacturing tolerances, thus ensuring that the notch frequency can be calibrated to the required frequency. Any form of variable capacitance may be used, but in preferred embodiments the second capacitive element comprises a varactor and/or a switched capacitor bank. Varactors are particularly beneficial as they are relatively inexpensive components and their capacitance can be readily adjusted by varying the voltage across the device. It will be appreciated that, as the second and fourth inductive elements are also important in setting the notch frequency, in principle these could be varied instead of (or as well as) the second capacitive element. However, in most practical applications it is difficult to create variable inductances and hence variable capacitive elements are preferred.

Similarly, the first capacitive element may have an adjustable capacitance. The first capacitive element may comprise a varactor and/or a switched capacitor bank. The first capacitive element varies the center frequency and bandwidth of the passband at frequencies lower than the notch (which may be referred to as the lower passband), and more so at frequencies higher than the notch (which may be referred to as the upper passband). The tunability of the upper passband is particularly advantageous for UWB devices where the allowed transmission band varies from region to region. For example, with a suitably sized and adjustable first capacitive element, the center frequency of the upper passband can be adjusted from around 6 to 10 GHz which allows the filter profile to be adjusted for a more suitable match to different regulatory bands such as the ETSI, KCC and FCC frequency bands. Again, it will be appreciated that, as the first and third inductive elements are also important in setting the centre frequencies, in principle these could be varied instead of (or as well as) the first capacitive element. However, in most practical applications it is difficult to create variable inductances and hence variable capacitive elements are preferred.

While the filter described above is useful on its own as a single notch (or band-stop) filter, particularly preferred embodiments of the invention provide a filter comprising a first notch filter and a second notch filter, each of the first notch filter and the second notch filter being a filter as described above (optionally including any of the preferred and optional features also described above); wherein the first notch filter and the second notch filter are cross-coupled by connecting an output of the first notch filter to an input of the second notch filter and connecting an output of the second notch filter to an input of the first notch filter.

The concept of cross-coupling two notch filters in this way is believed to be independently inventive and thus a further aspect of the invention provides a filter comprising a first notch filter and a second notch filter, wherein the first notch filter and the second notch filter are cross-coupled by connecting an output of the first notch filter to an input of the second notch filter and connecting an output of the second notch filter to an input of the first notch filter. It will be appreciated that the first notch filter and the second notch filter are preferably differential filters. It will also be appreciated that the preferred features described elsewhere in this document also apply to this aspect of the invention.

Preferably the negative arm of the first notch filter is connected to the input of the positive arm of the second notch filter and the output of the positive arm of the second notch filter is connected to the input of the negative arm of the first notch filter. The arrangement described above is cross-coupling with a weight of 1. As an alternative, it is also possible to do 'weighted' cross-coupling where the positive output of the first filter is amplified/attenuated (weighted), and the resulting signal is applied to the negative input of the second filter, and vice-versa.

Thus preferably the output of the first notch filter is amplified or attenuated before being applied to the input of the second notch filter and wherein the output of the second notch filter is respectively amplified or attenuated before being applied to the input of the first notch filter. Thus either both cross-coupling connections are amplified or both cross-coupling connections are attenuated. Further for symmetry, the gains should be the same in both connections (a gain of 1 being unweighted coupling, a gain of >1 being amplified weighted coupling and a gain of <1 being attenuated weight coupling).

By cross-coupling both the first notch filter and the second notch filter together, the effects of both filters combine together to provide a deeper and/or wider notch at the expense of higher insertion loss.

If the first notch filter and the second notch filter are identical then both the first and second notch filters have their notches at the same frequency, thus providing a particularly efficient and deep notch. However, in particularly preferred embodiments the first and second notch filters are non-identical such that the notch frequency of the first notch filter is different from the notch frequency of the second notch filter. The filter thus forms a dual notch filter or a wideband notch filter (essentially a dual notch filter with the two notches close together so they overlap significantly.

In preferred arrangements the notch frequencies are determined by the second capacitive element of each notch filter and therefore in preferred embodiments the second capacitive element of the first notch filter has a different value from the second capacitive element of the second notch filter.

By having the two individual notch filters with different notches, both notches appear in the output of the combined filter. Such arrangements can be used to reject two specific frequencies (or narrow frequency bands), but a preferred arrangement is to have a small frequency difference between the first and second notch frequencies such that the two notches overlap and combine to produce a wideband notch. This can be particularly advantageous for example to provide good signal rejection across the full range of the 5 GHz ISM channels, i.e., across the frequency range of 5.1 GHz to 5.8 GHz.

Thus, according to preferred embodiments, the second capacitive element of the first notch filter and the second capacitive element of the second notch filter are selected so as to create two frequency notches sufficiently closely spaced as to from a single wideband notch. It will be appreciated that each notch produces a high level of rejection at its specific notch frequency, with the frequency rejection being of a lesser degree in between the two notches. However, with the two notches arranged to be sufficiently close, the rejection will remain better than a certain level between the two notches, i.e. there will be a certain level of rejection across the full bandwidth spanning the two notches.

While the first and second notch filters may have different notch frequencies, more generally, the two filters need not be otherwise identical, i.e. the first and second notch filters may be asymmetrical. For example, the capacitances of one notch filter may be different from those of the other notch filter. Similarly, the inductances of one notch filter may be different from those of the other notch filter. In some embodiments the two filters could even be of different orders.

It will be appreciated that the invention extends to a circuit comprising a filter as described above. The circuit may comprise a differential filter input, a differential filter output and a filter as described above connected between the differential filter input and the differential filter output.

According to another aspect, there is provided a method of filtering a differential signal, comprising: applying the differential signal to the filter as described above upstream of the first inductive element and the third inductive element; and providing the differential filter output from the first node and the second node.

The trifilar transformer described above is also considered to be independently inventive. Therefore, according to a further aspect, there is provided a trifilar transformer comprising: a first winding; a second winding; and a third winding, wherein one winding is mutually coupled to each of the other two windings, and wherein said other two windings are substantially not coupled to each other. Preferably at least one of the first winding, the second winding and the third winding comprises a figure-of-eight winding. In some arrangements, the figure-of-eight winding may comprise a clockwise loop and an anti-clockwise loop. In some embodiments the first winding is a figure-of-eight winding and the second and third windings are each loop windings, one of the loop windings coupling with the clockwise loop and the other loop winding coupling with the anti-clockwise loop. The two loop windings are not coupled to each other, but each loop winding is mutually coupled with the figure-of-eight winding via its respective clockwise or anti-clockwise loop.

In other embodiments of the invention, a trifilar transformer may comprise: a first winding; a second winding; and a third winding formed from a first winding part in series with a second winding part, the first winding part having a shape corresponding to the first winding and the second winding part having a shape corresponding to the second winding.

As the third winding parts have shapes that correspond to both of the first and second windings the third winding will have moderate to strong mutual coupling with both the first winding and the second winding. Preferably the shape of the third winding is such that it substantially follows the shape that would be formed by series connecting the first winding to the second winding.

The second winding may be concentric or interwound with the first winding. Alternatively, the first winding and the second winding may be stacked in two metal layers. In particularly preferred arrangements the first winding is a loop winding and the third winding is in the same metal layer as the first winding. The longer third winding is then concentric or interwound with the simple loop winding which requires fewer cross-overs (and therefore fewer vias).

In particularly preferred embodiments the trifilar transformer is a two layer stacked transformer; wherein the first winding is formed in a first layer; wherein the second winding is formed in the first layer; and wherein the third winding is formed in a second layer. As described above, the use of two metal layers allows much better coupling between the layers as well as minimising the use of vias to bridge over other traces. It is also possible to implement this trifilar transformer with each of the three windings in its own distinct layer (i.e. using three thick metal layers).

In preferred embodiments the second winding is shaped so as to have a near-zero mutual coupling with the first winding. This can be achieved by having concentric (preferred) or interwound windings where the inner winding follows the outer winding over part of its loop (e.g. up to about half of its loop) in a co-current arrangement (i.e. so that the currents in the first and second windings flow in the same direction) while the inner winding follows the outer winding over another part of its loop in a counter-current arrangement (again up to about half of its loop and preferably the same proportion as the co-current section). The mutual inductance from the co-current flowing part cancels the mutual inductance from the counter-current flowing part, thus resulting in a net low mutual coupling.

In particularly preferred arrangements the first winding has a loop shape and the second winding has a figure-of-eight shape and is formed inside the first winding. The figure-of-8 shape achieves the aforementioned co-current and counter-current flow sections to reduce the mutual coupling. As described above, in other embodiments the figure-of-eight winding can be formed outside the loop winding with the use of vias into an adjacent metal layer to bridge the traces of the loop winding.

It will be appreciated that this trifilar design has moderate to strong mutual coupling between two winding pairs with near-zero mutual coupling between the third winding pair. This allows for new and efficient circuit designs where mutual coupling is desired between two windings and a third winding while avoiding mutual coupling between the first two windings. The design of the transformer requires that the third winding has a greater length than that of each of the first and second windings and therefore this does provide a design constraint, but this transformer is nevertheless extremely useful in certain circumstances. Examples of uses are in low-noise amplifiers for gain-boosting as well as in filters for area saving such as those described above.

Preferably the first winding, the second winding and the third winding are separate and distinct windings. As the three windings are separate and distinct, each winding can be connected without limitation to different parts of a circuit, thus allowing increased flexibility of use.

The trifilar transformer preferably comprises six ports, wherein: the first winding extends between a first port and a second port; the second winding extends between a third port and a fourth port; and the third winding extends between a fifth port and a sixth port. Thus each winding is formed from a conductive track that has one port at each end. As each of the three windings is separate and distinct from the other two there are no shared ports, i.e. no ports that are shared by (electrically connected to) two of the three windings.

Certain preferred embodiments of the invention will now be described by way of example only, and with reference to the accompanying drawings in which:

FIG. 8a shows the frequency response of the filters of FIG. 4 and FIG. 7;

FIG. 8b illustrates how the upper pass-band can be tuned for different applications;

FIG. 8c illustrates a dual notch and a wideband notch;

FIG. 9 shows the mutual couplings of the transformer of FIG. 10;

FIG. 10 shows a trifilar transformer formed in two layers with stacked windings;

Figure 11:
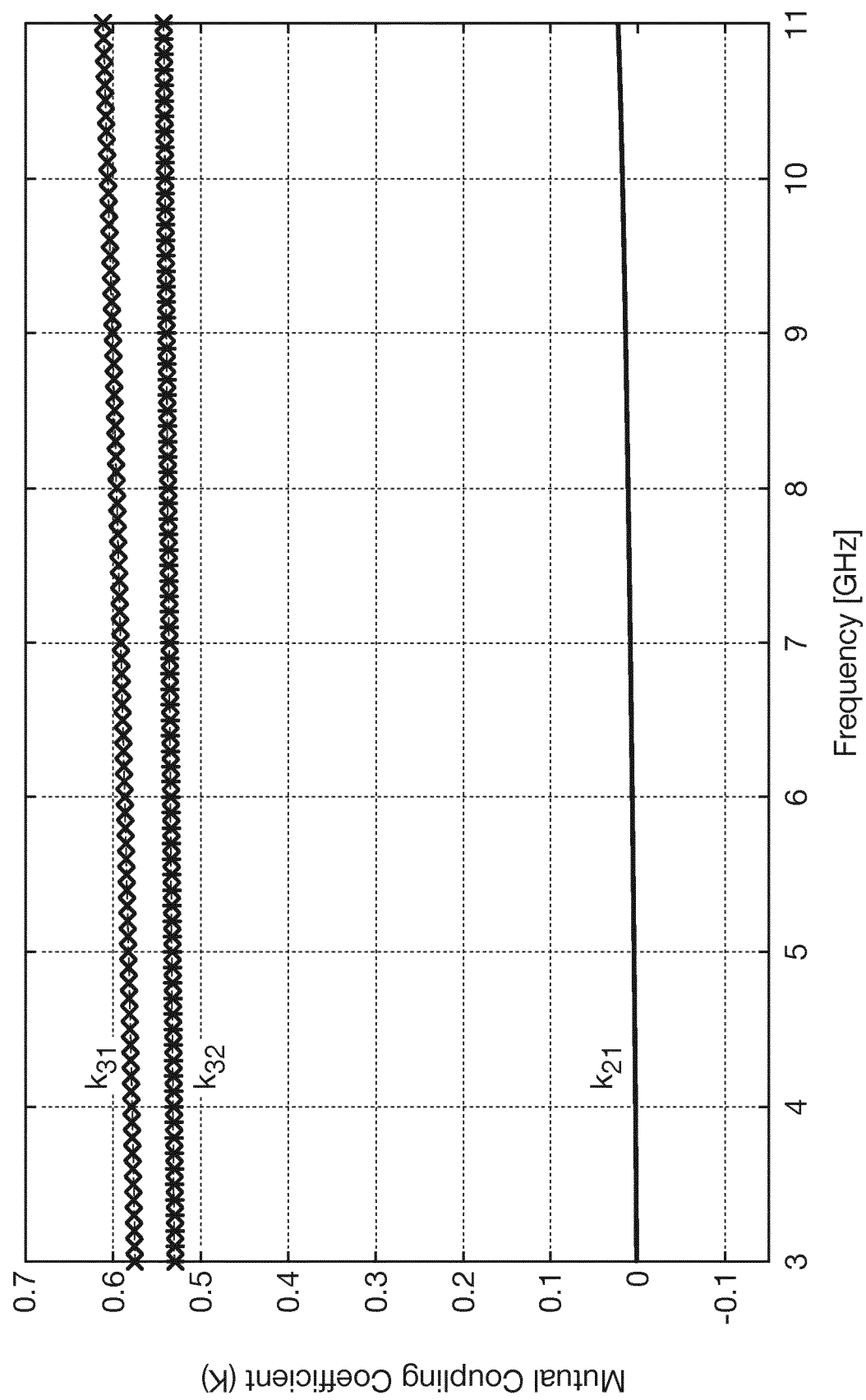
Figure 12:
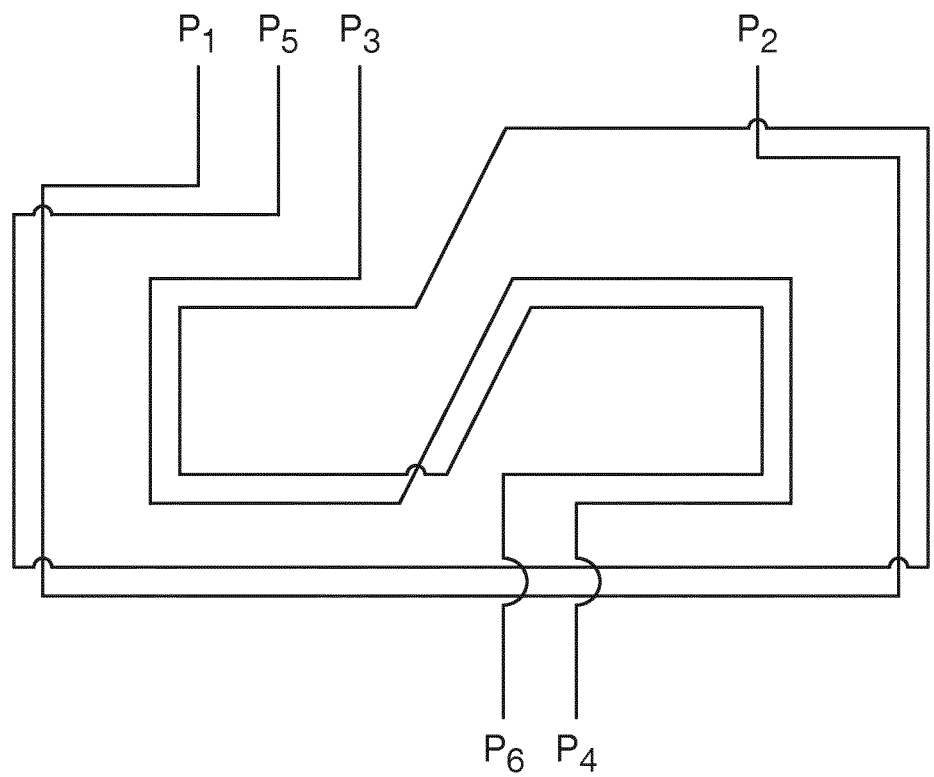
Figure 13A:
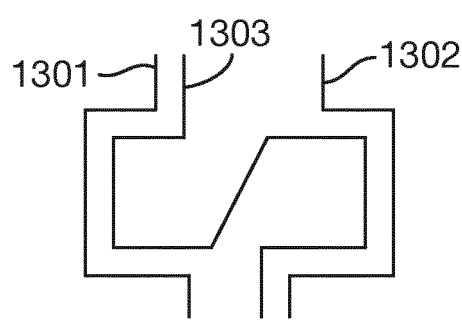
Figure 13B:
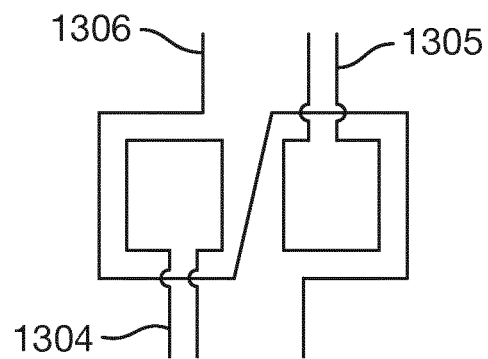
Figure 14:
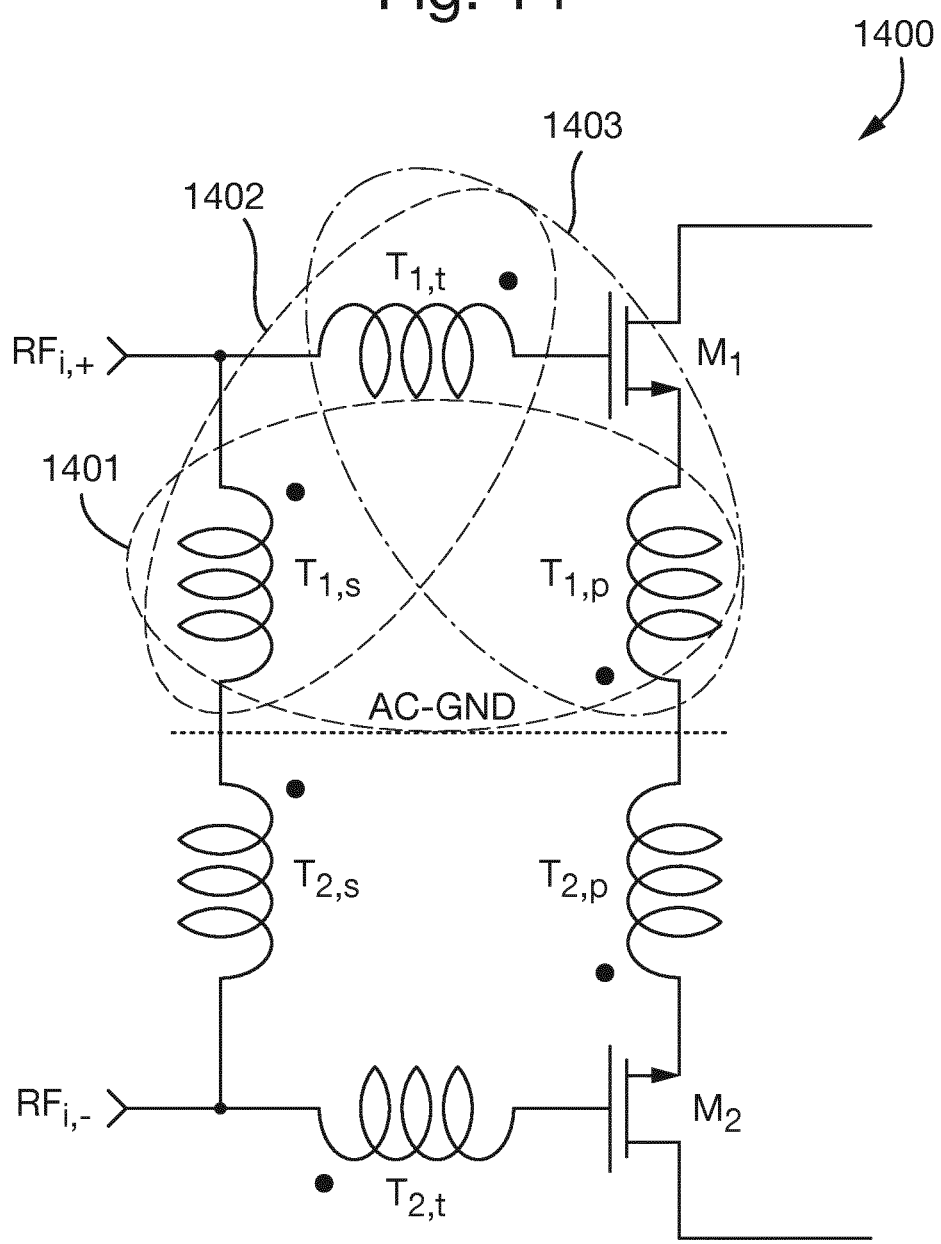

FIG. 11 plots the coupling coefficients of the transformer of FIG. 10 against frequency;

FIG. 12 illustrates an arrangement of a trifilar transformer with all windings in a single layer;

FIG. 13 illustrates two examples of trifilar transformers with loop windings partially coupling to a single figure-of-eight winding; and FIG. 14 illustrates a trifilar transformer used in an amplifier.

Figure 1:
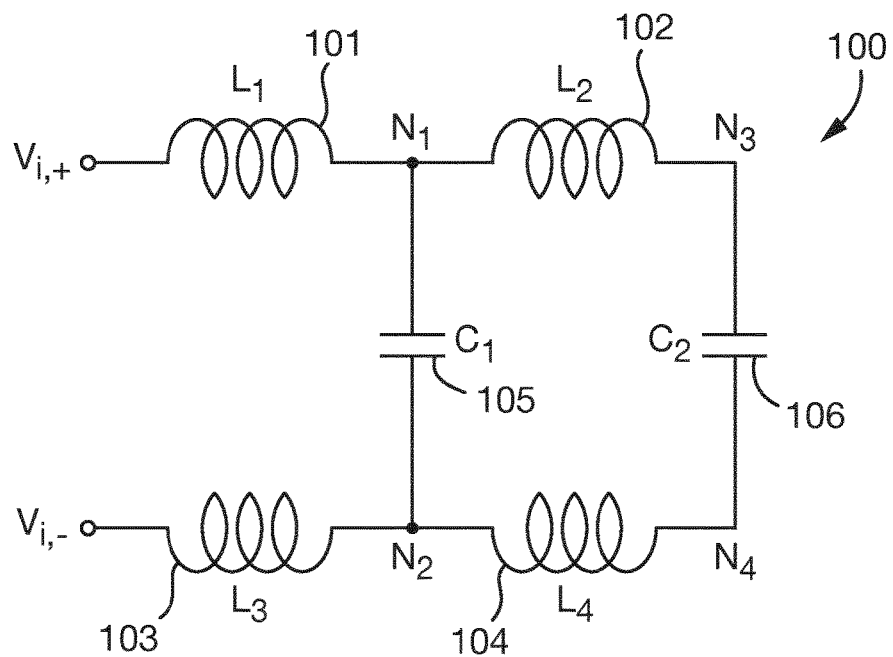
FIG. 1 shows a conventional LC ladder filter.

FIG. 1 shows a traditional differential $4^{th}$-order LC-ladder filter 100. The filter 100 is formed from four inductive elements ($L_1$, $L_2$, $L_3$ and $L_4$) 101, 102, 103, 104 and two capacitive elements ($C_1$ and $C_2$) 105, 106. For symmetry, inductive elements $L_1$ and $L_2$ are identical to $L_3$ and $L_4$, respectively. Thus, this filter 100 is a differential filter with the inductors 101, 102 forming a first signal arm (e.g., positive arm) and the inductors 103, 104 forming a second signal arm (e.g., negative arm). The first and second capacitors 105, 106 bridge the two signal arms from node $N_1$ to $N_2$ and from node $N_3$ to $N_4$, respectively. The response of the filter is determined by its coefficients, i.e., reactance values of the passive elements. The input signal to the filter 100 is applied at differential inputs and $V_{i,+}$ and $V_{i,-}$ upstream of inductors 101 and 103, respectively, and the output is taken across 106 forming a low-pass filter.

Figure 2:
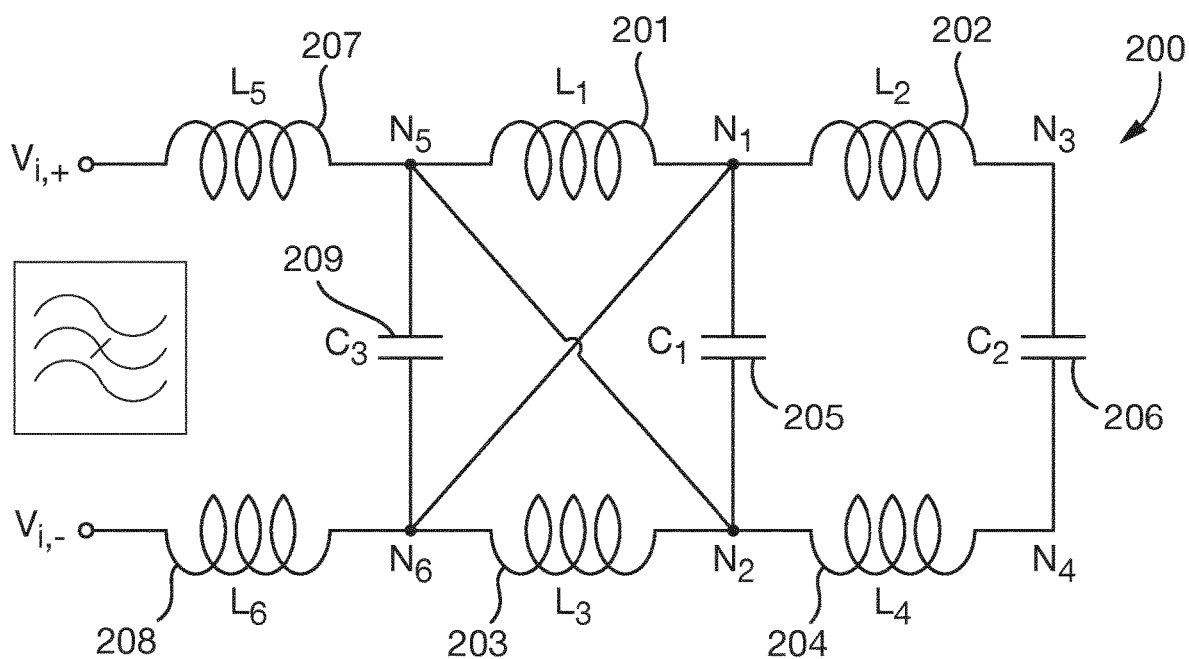
FIG. 2 illustrates a first embodiment of a cross-coupled LC notch filter.

FIG. 2 shows a development of the basic LC ladder filter 100 according to an embodiment of the invention. The filter 200 of FIG. 2 is a $6^{th}$-order LC-ladder filter and is formed from six inductive elements ($L_1$, $L_2$, $L_3$, $L_4$, $L_5$, and $L_6$) 201, 202, 203, 204, 207, 208 and three capacitive elements ($C_1$, $C_2$ and $C_3$) 205, 206, 209. For symmetry, inductive element $L_3$ is identical to $L_1$, inductive element $L_4$ is identical to $L_2$, and inductive element $L_5$ is identical to $L_6$. $L_1$ is not necessarily identical to $L_2$. This filter arrangement differs from a traditional LC ladder filter by virtue of the cross coupling between nodes $N_1$ and $N_6$ and between nodes $N_2$ and $N_5$. This cross-coupling is applied across the first inductive element 201 and the third inductive element 203, the upstream side of the first inductive element 201 (node $N_5$) being connected to the downstream side of the third inductive element 203 (node $N_2$) and the upstream side of the third inductive element 203 (node $N_6$) being connected to the downstream side of the first inductive element 201 (node $N_1$).

The second inductive element 202 and fourth inductive element 204 together with the second capacitive element 206 largely determine the frequency of a notch in the filter response. The notch produces a narrow signal rejection band around the notch frequency that divides the overall filter response into an upper pass-band (frequencies higher than the notch frequency) and a lower pass-band (frequencies lower than the notch frequency). Due to the frequency response of the inductors formed in thick metal layers (due to ohmic losses and eddy-currents as described above), the overall frequency response of the filter is also reduced at low frequencies (at the lower end of the lower pass-band) and at high frequencies (at the higher end of the upper pass-band). The cross-coupled inductors (first inductor 201 and third inductor 203) define the shape of the lower pass-band (the cross-coupling essentially forms a band-pass response where a low-pass response would otherwise be expected).

The fifth and sixth inductive elements 207, 208 and the third capacitive element 209 may be individual components (i.e. specifically formed as part of the circuit) or they may be intrinsic inductances and capacitances of the bond wires and bond pads in an on-chip implementation.

Figure 3:
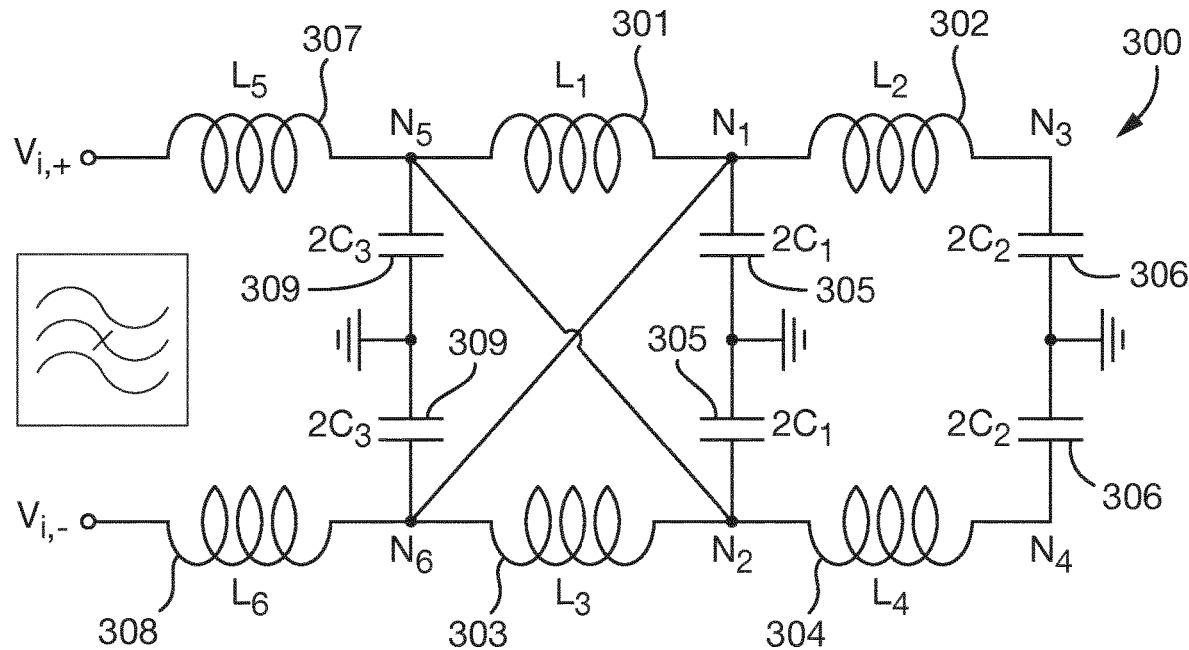
FIG. 3 illustrates a second embodiment of a cross-coupled LC notch filter with AC ground plane.

FIG. 3 also shows a $6^{th}$-order LC-ladder filter 300 similar to that of FIG. 2, again comprising six inductive elements ($L_1$, $L_2$, $L_3$, $L_4$, $L_5$, and $L_6$) 301, 302, 303, 304, 307, 308. In this embodiment though, the capacitive elements have been split so as to form an AC ground plane. Thus there are six capacitive elements ($2 \times 2C_1$, 305, corresponding to the first capacitive element 205 of FIG. 2, $2 \times 2C_2$, 306, corresponding to the second capacitive element 206 of FIG. 2 and $2 \times 2C_3$, 309, corresponding to the third capacitive element 209 of FIG. 2). Each pair of capacitors 305, 306, 309 forms an AC ground node at the axis of symmetry. As with FIG. 2, for symmetry, inductive elements $L_3$ and $L_4$ are identical to $L_1$ and $L_2$, respectively (although $L_1$ does not necessarily equal $L_2$) and inductive element $L_5$ is identical to $L_6$. Cross-coupling is provided between nodes $N_1$ and $N_6$ and between nodes $N_2$ and $N_5$. Otherwise, operation of the filter 300 of FIG. 3 is the same as that of filter 200 of FIG. 2.

Figure 4:
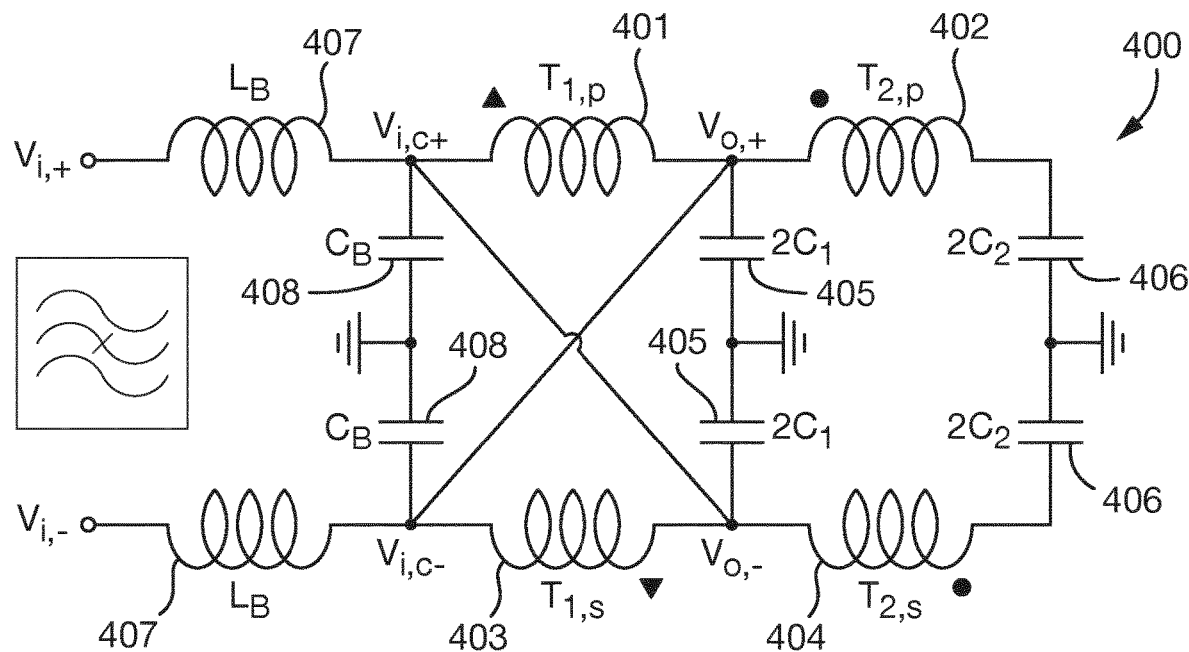
FIG. 4 illustrates a third embodiment of a cross-coupled transformer-capacitor notch filter with AC ground plane.

FIG. 4 shows another embodiment, being a further variation of the circuit shown in FIG. 3. The filter 400 of FIG. 4 is a $6^{th}$-order transformer-C band-stop (notch) filter. Two transformers are used, namely a first transformer $T_1$ with windings $T_{1,p}$ and $T_{1,s}$, and a second transformer $T_2$ with windings $T_{2,p}$ and $T_{2,s}$. The first transformer windings $T_{1,p}$, 401 and $T_{1,s}$, 403 replace the first and third inductive elements 301, 303 of FIG. 3 respectively. The second transformer windings $T_{2,p}$, 402 and $T_{2,s}$, 404 replace the second and fourth inductive elements 302, 304 of FIG. 3 respectively. Inductive elements $2 \times L_B$, 407 and the six capacitive elements ($2 \times 2C_1$, 405, $2 \times 2C_2$, 406, and $2 \times 2C_B$, 408) are similar to the corresponding components from FIG. 3, although the subscript B indicates that inductive elements $L_B$ and capacitive elements $C_B$ are parasitic bondwire inductances and bondpad capacitances respectively (although this should not be construed as limiting). Cross coupling is provided between nodes $V_{o,+}$ and $V_{i,c-}$ and between nodes $V_{o,-}$ and $V_{i,c+}$. As with the filters 200 and 300, the filter 400 of FIG. 4 is designed to receive a differential signal input on nodes $V_{i,+}$ and $V_{i,-}$ and to generate the filtered differential output on nodes $V_{o,+}$ and $V_{o,-}$.

In FIG. 4, $T_{1,p}$ is tightly coupled to $T_{1,s}$ and similarly $T_{2,p}$ is tightly coupled to $T_{2,s}$. There is no coupling between, $T_1$ and $T_2$. However, windings $T_{1,p}$ and $T_{2,p}$ are series connected and moderately coupled to windings $T_{1,s}$ and $T_{2,s}$, respectively. Likewise, windings $T_{1,s}$ and $T_{2,s}$ are series connected and moderately coupled to windings $T_{1,p}$ and $T_{2,p}$, respectively. So, two out of three coupling coefficients are non-zero and one coupling coefficient is near-zero.

The advantage of using transformers in place of inductors is that the mutual coupling increases the effective inductances which means that smaller inductor windings can be used to achieve the same effect (i.e., self-inductance), thus reducing chip area. A high Q factor can still be realized to provide sharp transitions at the notch. This is particularly useful in UWB applications as it improves the utilization of the available spectrum next to the notch, while still ensuring good signal rejection at the unwanted frequencies centred on the notch.

Figure 5:
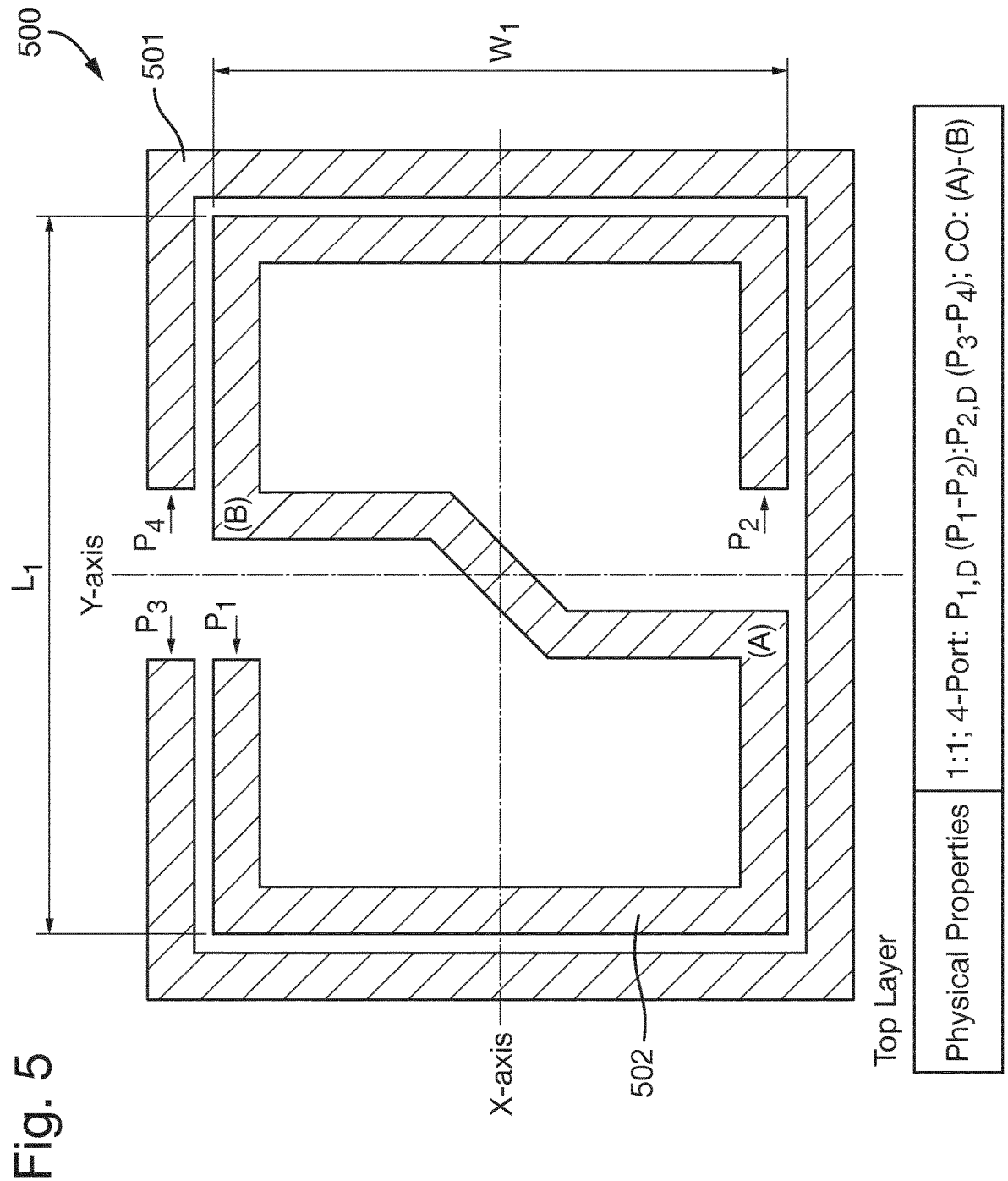
FIG. 5 shows nested transformer coils with near-zero mutual coupling.

In a particularly preferred arrangement, $T_1$ and $T_2$ are each formed as stacked transformers, each with its two windings formed in different thick RF metal layers, one above the other. With this arrangement, the two transformers can be formed concentrically with one another, i.e., with the windings of one transformer inside the windings of the other transformer. This is a particularly area efficient solution as the area inside the outer windings would otherwise not normally be used. If the two transformers have windings that are the same shape (i.e., the windings of the inner transformer are substantially the same shape as those of the outer transformer) then there will be mutual coupling between the two transformers. A particularly elegant and advantageous solution is to form the inner transformer windings with a figure-of-eight shape so that they are partly in co-current arrangement with the outer windings and partly in counter-current arrangement with the outer windings. With the co-current and counter-current sections having about equal self-inductances, the mutual couplings will cancel out so that the inner transformer does not couple with the outer transformer. If the two metal layers are of equal thickness, the co-current and counter-current sections can have approximately equal lengths and widths. However, in the case that one of the metal layers is thicker than the other (which may be preferred in some cases, e.g. for other components) then the self-inductances can be matched by adjusting the widths of the traces appropriately (the lengths being largely determined by the winding arrangement). FIG. 5 shows one layer of windings with an outer winding 501 formed as a loop (in this case a rectangular loop) around the inner winding 502 which has a figure-of-eight shape or S-shape (in this case a squared figure-of-eight or S-shape). It can be seen that if one half (e.g. the left side of FIG. 5) of the windings 501, 502 is in co-current arrangement then the other half (the right side of FIG. 5) will be in counter-current arrangement, and vice versa. Therefore, these windings have substantially no mutual coupling.

Figure 6:
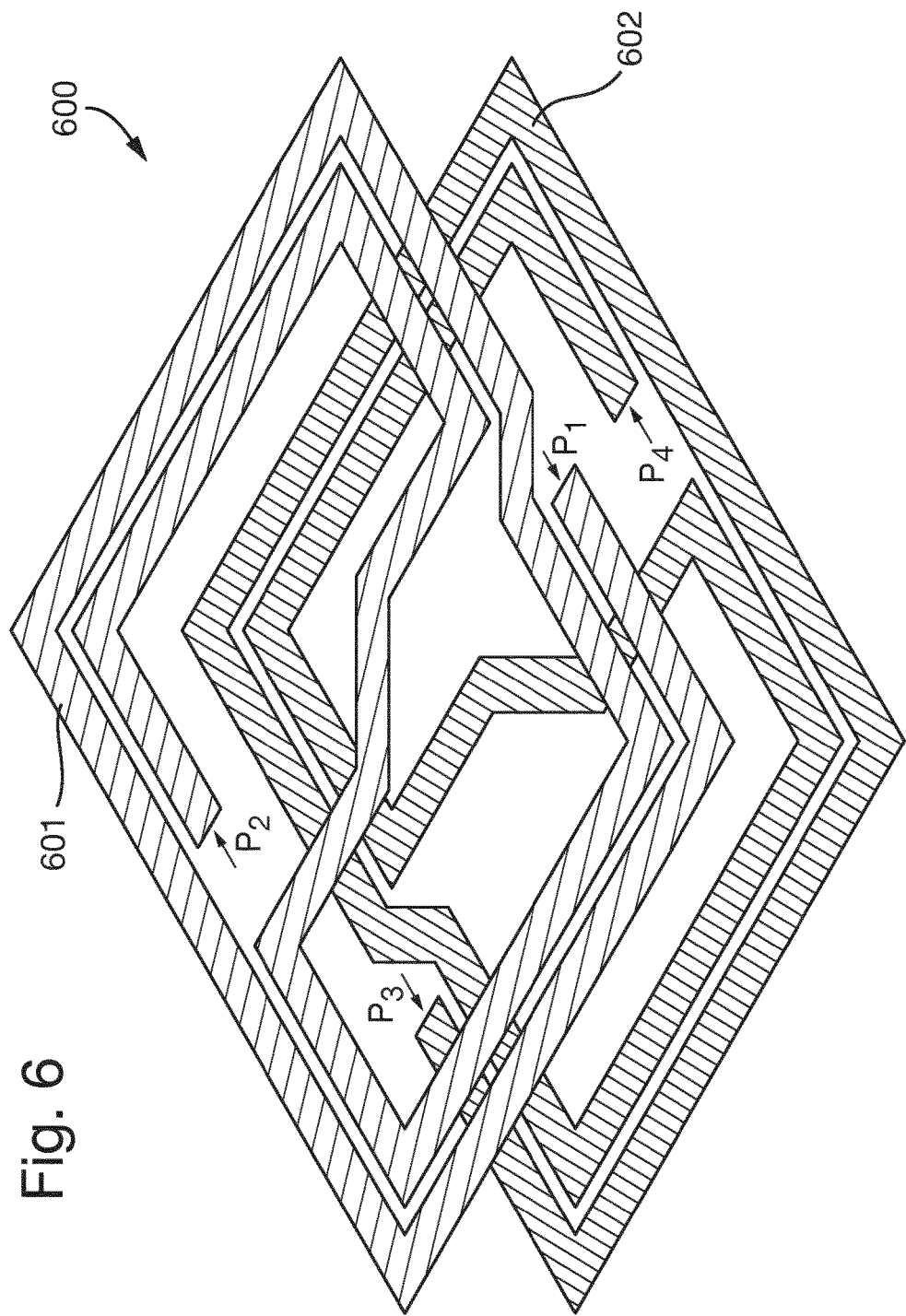
FIG. 6 shows a two layer stacked transformer each layer having nested, series-connected windings, suitable for use with the embodiment of FIG. 4.

FIG. 6 shows how the two transformers of FIG. 4 can be formed in two RF thick metal layers, each layer having concentric windings as shown in FIG. 5 and each of those layers having the two windings series connected as shown in FIG. 4 (i.e., $T_{1,p}$ is series connected to $T_{2,p}$ and these windings are formed in one layer as ports $P_1$-$P_2$ (601) while $T_{1,s}$ is series connected to $T_{2,s}$ are these windings are formed in the other layer as ports $P_3$-$P_4$ (602)).

The two outer, rectangular windings in FIG. 6 are wound in opposite directions to each other. Similarly, the inner, figure-of-eight windings are wound in opposite directions to each other. If the outer windings are in counter-current (inverting) arrangement with each other, the inner windings are also in counter-current (inverting) arrangement with each other to exploit mutual coupling in a differential arrangement. Thus, the mutual coupling adds to the self-inductances of each winding so that the overall area can be reduced for a given effect.

The inner, figure-of-eight windings form the first transformer $T_1$ and the outer, rectangular windings form the second transformer $T_2$ as the higher Q of the rectangular windings gives better notch properties.

Figure 7:
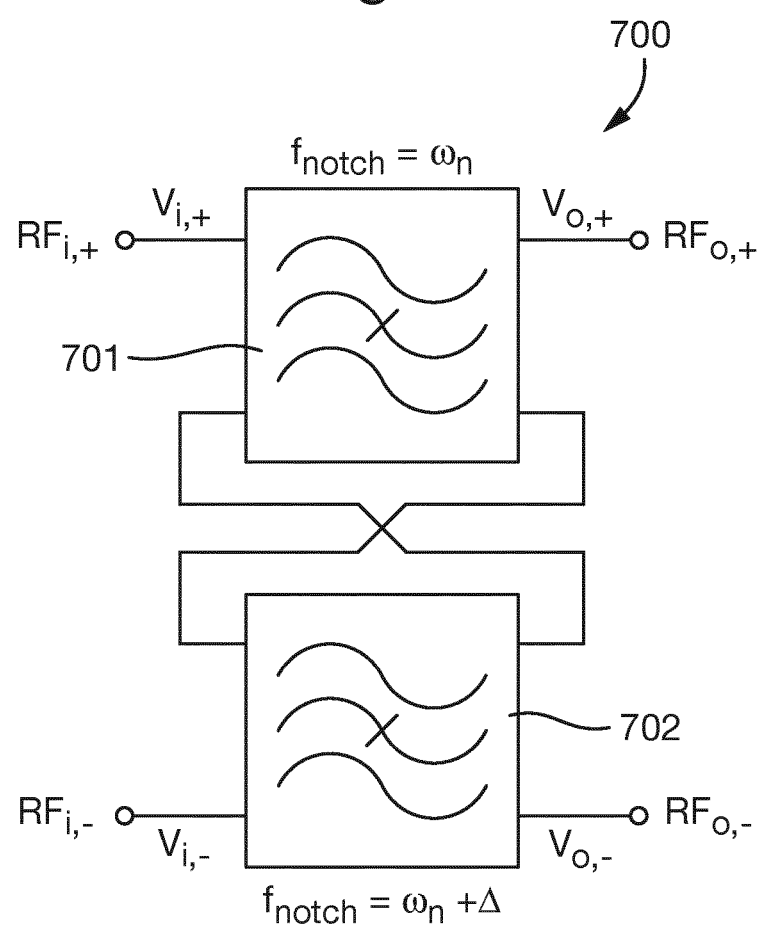
FIG. 7 shows how two filters can be cross-coupled to form a deep or wideband notch.

FIG. 7 shows an improved filter 700 formed from two cross-coupled notch (or band-stop) filters 701, 702 cross-coupled together to generate a wider and/or deeper notch. Each filter 701, 702 may be a notch (or band-stop) filter 200, 300, 400 as depicted in any of FIG. 2-4. Each filter 701, 702 includes the cross-coupling described above (e.g. nodes $N_2$-$N_5$ and $N_1$-$N_6$) and the two filters 701, 702 are then further cross-coupled together. This cross-coupling of filter 701 to filter 702 is achieved by connecting the negative filter output of first filter 701 to the positive filter input of second filter 702 and connecting the positive filter output of second filter 702 to the negative filter input of first filter 701.

As indicated in FIG. 7, the first filter 701 has a notch at $f_{notch,1}=\omega_n$ and the second filter 702 has a notch at $f_{notch,2}=\omega_n+\Delta$. Where $\Delta=0$, the two filters 701, 702 have the same notch frequency and combine together to form a deeper notch for better rejection at this frequency. However, a particular benefit of this arrangement is where $\Delta$ is non-zero and the first and second filters 701, 702 have different notch frequencies. These combine together in the overall frequency response of filter 700 to produce two separate notches (if $\Delta$ is large enough to separate the notches) or to combine the two notches into a wideband notch (if $\Delta$ is small enough to keep the signal rejection at a high enough level in between the two notches). This latter arrangement is particularly convenient for achieving excellent rejection of an unwanted frequency band with a lot of traffic such as the 5.1-5.8 ISM band (which often includes a large amount of WLAN signal).

FIG. 8a shows the filter response of single band-stop filter 400 of FIG. 4 (solid line) and of the cross-coupled filter 700 of FIG. 7 (dashed line), being two cross-coupled band-stop filters 701, 702, each being a filter 400 of FIG. 4, the two filters 701, 702 both having notches at $\omega_n$ so as to create a deep notch.

FIG. 8b shows how the upper passband of the filter can be tuned by varying the capacitance of an adjustable first capacitive element. The center frequency of the upper passband $f_{c,high}$ is changed from 7.29 GHz (solid line) to 8.74 GHz (dashed line). It can be seen that the former is better suited for filtering the signal in the ETSI band (which spans 6-8.5 GHz), while that of the latter is better suited for filtering the signal in the KCC band (spanning 8-10 GHz). Additionally, it can be seen that effect of varying the first capacitive element has a large effect on the upper passband, the effect on the lower passband is much smaller.

FIG. 8c shows the output of a filter as shown in FIG. 7 with two different notch frequencies. The solid line shows an example where the two frequencies are sufficiently close together that they overlap and form a single wideband notch (the filter response between the two notch frequencies never rises above about −23 dB), while the dashed line shows an example where the two frequencies are separated to form two distinct notches (with the filter response rising to 0 dB between them, thus forming a distinct narrow pass band between the two notches).

As discussed above, the principles of the stacked and concentric windings illustrated in FIG. 5 and FIG. 6 can be used to create a trifilar transformer with unique properties. FIG. 9 illustrates the technical result of the trifilar transformer that is shown in FIG. 10. Three windings are illustrated: a primary winding $L_p$, a secondary winding $L_s$ and a tertiary winding $L_t$. Three winding pairs can be formed from these three windings and the coupling coefficients are illustrated as $k_1$ (coupling between primary $L_p$ and secondary $L_s$), $k_2$ (coupling between secondary $L_s$ and tertiary $L_t$) and $k_3$ (coupling between primary $L_p$ and tertiary $L_t$). In a traditional trifilar transformer, all of these coupling coefficients would be non-zero, indicating that there is mutual coupling between all three winding pairs. However, with the trifilar transformer arrangement shown in FIG. 10, the transformer can have two of these three coupling coefficients being non-zero while the third coupling coefficient is near-zero.

FIG. 10 shows the trifilar transformer 1000 formed as a stacked transformer with the one layer (the upper layer shown in FIG. 10) having two concentric windings 1001 and 1002. The inner winding 1002 is between ports $P_1$ and $P_2$ and takes a figure-of-eight-shape (or S-shape, these terms being intended to be equivalent) and the outer winding 1001 is between ports $P_3$ and $P_4$ and is in the form of a loop winding (such as a rectangular winding, although in other embodiments circular or octagonal windings may be used) around the inner winding 1002. In this embodiment the outer winding 1001 is a rectangular winding and the inner winding 1002 is a squared figure-of-eight winding for convenience of manufacturing and efficient area usage in on-chip implementations. The other layer (the lower layer shown in FIG. 10) has a single winding 1003 which is formed from two parts, the first part 1004 having a shape matching that of winding 1001 and a second part 1005 having a shape matching that of winding 1002. The first part 1004 is series connected to the second part 1005 to form the third winding 1003 between ports P₅ and P₆.

If the three windings 1001, 1002 and 1003 are identified as primary winding (1002, figure-of-eight, P₁-P₂), secondary winding (1001, rectangular, P₃-P₄) and tertiary winding (1003, combination, series-connected windings, P₅-P₆), then the coupling coefficients $k_1$ (primary-secondary) is near-zero due to the cancellation of mutual inductance that results from the co-current/counter-current arrangement of the figure-of-eight winding inside the outer rectangular winding, while the other two coupling coefficients $k_2$ (secondary-tertiary) and $k_3$ (primary-tertiary) are non-zero, exhibiting moderate mutual coupling. Thus, the trifilar transformer of FIG. 10 realises a transformer with two non-zero and one near-zero coupling coefficients, i.e., with $k_1=0$, $0<k_2<1$ and $0<k_3<1$.

FIG. 11 shows the coupling coefficients of the transformer of FIG. 10 plotted against frequency. Coupling coefficients between primary-secondary ($k_{21}$), primary-tertiary ($k_{31}$) and secondary-tertiary ($k_{32}$) windings of the trifilar transformer of FIG. 10 show near-zero coupling coefficient $k_{21}$ and moderate coupling coefficients $k_{31}$ and $k_{32}$ of around 0.5-0.6.

FIG. 12 illustrates an arrangement of a trifilar transformer with all windings in a single layer. A first winding P₁-P₂ is a rectangular loop, a second winding P₃-P₄ is a figure-of-eight winding. A third winding P₅-P₆ is a rectangular winding series connected to a figure-of-eight winding with a shape that substantially follows (matches) the shapes of the other two loops (P₁-P₂, P₃-P₄). As a number of cross-overs are involved, a number of short hops need to be made into an adjacent layer, using vias in order to form this structure, but the majority of the three windings are formed in the same thick metal layer. The adjacent metal layer used for cross-overs need not be a thick metal layer.

FIG. 13 illustrates two examples of trifilar transformers with loop windings partially coupling to a single figure-of-eight winding. In FIG. 13(a) the two C-shaped loop windings 1301, 1302 are formed outside of the figure-of-eight winding 1303. The loop winding 1301 mutually couples to the anti-clockwise loop of the figure-of-eight winding 1303 while the loop winding 1302 mutually couples to the clockwise-loop of the figure-of-eight winding 1303. The two loop windings 1301, 1302 are not mutually coupled to each other.

In FIG. 13(b) the two loop windings 1304, 1305 are formed inside the figure-of-eight winding 1306. The loop winding 1304 mutually couples to the anti-clockwise loop of the figure-of-eight winding 1306 while the loop winding 1305 mutually couples to the clockwise-loop of the figure-of-eight winding 1306. The two loop windings 1304, 1305 are not mutually coupled to each other.

FIG. 14 shows an amplifier 1400 which uses a trifilar transformer such as those shown in FIG. 10, 12 or 13. The amplifier 1400 is a single stage, common source transconductance amplifier. Impedance matching in this amplifier is a function of the transconductance and the turns ratio of the negative (current) feedback which is realised by the mutual coupling between and the self-inductances of the primary winding $T_{1,p}$ and the secondary winding $T_{1,s}$ (inverted coupling) as indicated by the oval 1401 in the drawing. Passive gain boosting is realised by the mutual coupling between and the self-inductances of the secondary winding $T_{1,s}$ and the tertiary winding $T_{1,t}$ as indicated by the oval 1402 in the drawing. Furthermore, maximum performance is achieved because the trifilar transformer has substantially no (near-zero) coupling between the primary winding $T_{1,p}$ and the tertiary winding $T_{1,t}$ as indicated by the oval 1403 in the drawing.

The amplifier 1400 is a differential amplifier which includes a second trifilar transformer with windings $T_{2,p}$, $T_{2,s}$ and $T_{2,t}$ on the other arm of the circuit and which operate in the same manner.

The invention claimed is:

1. A trifilar transformer comprising:
   a first winding;
   a second winding; and
   a third winding,
   wherein one of the first, second, and third windings is mutually coupled to each of the other two windings, and wherein said other two windings are substantially not coupled to each other;
   wherein the third winding is formed from a first winding part in series with a second winding part, the first winding part having a shape corresponding to the first winding and the second winding part having a shape corresponding to the second winding; and
   wherein the second winding is concentric or interwound with the first winding;
   wherein at least one of the first winding, the second winding and the third winding comprises a figure-of-eight winding.

2. A trifilar transformer as claimed in claim 1, wherein the second winding is shaped so as to have near-zero mutual coupling with the first winding.

3. A trifilar transformer as claimed in claim 1, wherein the figure-of-eight winding comprises a clockwise loop and an anti-clockwise loop.

4. A trifilar transformer as claimed in claim 3, wherein the first winding is a figure-of-eight winding and the second and third windings are each loop windings, one of the loop windings coupling with the clockwise loop and the other loop winding coupling with the anti-clockwise loop.

5. A trifilar transformer as claimed in claim 1, wherein the transformer is a two layer stacked transformer;
   wherein the first winding is formed in a first layer;
   wherein the second winding is formed in the first layer; and
   wherein the third winding is formed in a second layer.

6. A trifilar transformer as claimed in claim 1, wherein the first winding and the second winding are stacked in two metal layers.

7. A trifilar transformer as claimed in claim 6, wherein the first winding is a loop winding and wherein the third winding is in the same metal layer as the first winding.

8. A trifilar transformer as claimed in claim 1, wherein the first winding has a loop shape and the second winding has a figure-of-eight shape.

9. A trifilar transformer as claimed in claim 8, wherein the second winding is formed inside the first winding.

10. A trifilar transformer as claimed in claim 1, wherein the first winding, the second winding and the third winding are separate and distinct windings.

11. A trifilar transformer as claimed in claim 10, wherein the transformer comprises six ports, wherein:
    the first winding extends between a first port and a second port;
    the second winding extends between a third port and a fourth port; and
    the third winding extends between a fifth port and a sixth port.

12. A trifilar transformer comprising:
a first winding;
a second winding; and
a third winding,
wherein one of the first, second and third windings is mutually coupled to each of the other two windings, and wherein said other two windings are substantially not coupled to each other;
wherein the third winding is formed from a first winding part in series with a second winding part, the first winding part having a shape corresponding to the first winding and the second winding part having a shape corresponding to the second winding; and
wherein the first winding and the second winding are stacked in two metal layers.

13. A trifilar transformer comprising:
a first winding;
a second winding; and
a third winding,
wherein one of the first, second and third windings is mutually coupled to each of the other two windings, and wherein said other two windings are substantially not coupled to each other;
wherein the first winding has a loop shape and the second winding has a figure-of-eight shape; and
wherein the second winding is formed inside the first winding.

14. A notch filter for a differential signal comprising a positive signal arm and a negative signal arm;
wherein the positive signal arm comprises a first inductive element in series with a second inductive element;
wherein the negative signal arm comprises a third inductive element in series with a fourth inductive element;
wherein a first capacitive element is connected between the positive signal arm and the negative signal arm, from a first node downstream of the first inductive element and upstream of the second inductive element to a second node downstream of the third inductive element and upstream of the fourth inductive element;
wherein a second capacitive element is connected between the positive signal arm and the negative signal arm, from a third node downstream of the second inductive element to a fourth node downstream of the fourth inductive element;
wherein a downstream end of the first inductive element is connected to an upstream end of the third inductive element;
wherein an upstream end of the first inductive element is connected to a downstream end of the third inductive element; and
wherein the differential output of the filter is taken from the first node and the second node;
wherein the first inductive element and the second inductive element are formed as a figure-of-eight winding series connected to a loop winding; and wherein the third inductive element and the fourth inductive element are formed as a figure-of-eight winding series connected to a loop winding.

15. A notch filter for a differential signal comprising a positive signal arm and a negative signal arm;
wherein the positive signal arm comprises a first inductive element in series with a second inductive element;
wherein the negative signal arm comprises a third inductive element in series with a fourth inductive element;
wherein a first capacitive element is connected between the positive signal arm and the negative signal arm, from a first node downstream of the first inductive element and upstream of the second inductive element to a second node downstream of the third inductive element and upstream of the fourth inductive element;
wherein a second capacitive element is connected between the positive signal arm and the negative signal arm, from a third node downstream of the second inductive element to a fourth node downstream of the fourth inductive element;
wherein a downstream end of the first inductive element is connected to an upstream end of the third inductive element;
wherein an upstream end of the first inductive element is connected to downstream end of the third inductive element; and
wherein the differential output of the filter is taken from the first node and the second node;
wherein the first inductive element and the third inductive element are mutually coupled to form a first transformer; and
wherein the first transformer is formed as a two layer, stacked transformer with the first inductive element and third inductive element in different layers.

16. A filter as claimed in claim 15 further comprising a fifth inductive element upstream of the first inductive element, a sixth inductive element upstream of the third inductive element and a third capacitive element connected between the positive signal arm and the negative signal arm, from a fifth node upstream of the first inductive element to a sixth node upstream of the third inductive element.

17. A filter as claimed in claim 15, wherein the second inductive element and the fourth inductive element are mutually coupled to form a second transformer.

18. A filter as claimed in claim 17, wherein the second transformer is formed as a two layer, stacked transformer with the second inductive element and fourth inductive element in different layers.

19. A filter comprising a first notch filter and a second notch filter, each of the first notch filter and the second notch filter being a filter according to claim 15;
wherein the first notch filter and the second notch filter are cross-coupled by connecting an output of the first notch filter to an input of the second notch filter and connecting an output of the second notch filter to an input of the first notch filter.

20. A filter as claimed in claim 15, wherein the first inductive element and the second inductive element are formed as a figure-of-eight winding series connected to a loop winding; and wherein the third inductive element and the fourth inductive element are formed as a figure-of-eight winding series connected to a loop winding.

21. A filter as claimed in claim 20, wherein the first and second inductive elements are formed in a first metal layer and the third and fourth inductive elements are formed in a second metal layer in stacked arrangement with the first and second inductive elements.

22. A filter as claimed in claim 20, wherein the second inductive element and the fourth inductive element are the figure-of-eight windings and wherein the first inductive element and the third inductive element are the loop windings.

23. A filter as claimed in claim 20, wherein the loop windings surround the figure-of-eight windings.

24. A filter comprising a first notch filter and a second notch filter,
wherein the first notch filter and the second notch filter are cross-coupled by connecting an output of the first notch filter to an input of the second notch filter and connecting an output of the second notch filter to an input of the first notch filter;

wherein each of the first notch filter and the second notch filter is a notch filter for a differential signal comprising a positive signal arm and a negative signal arm;

wherein the positive signal arm comprises a first inductive element in series with a second inductive element;

wherein the negative signal arm comprises a third inductive element in series with a fourth inductive element;

wherein a first capacitive element is connected between the positive signal arm and the negative signal arm, from a first node downstream of the first inductive element and upstream of the second inductive element to a second node downstream of the third inductive element and upstream of the fourth inductive element;

wherein a second capacitive element is connected between the positive signal arm and the negative signal arm, from a third node downstream of the second inductive element to a fourth node downstream of the fourth inductive element;

wherein a downstream end of the first inductive element is connected to an upstream end of the third inductive element;

wherein an upstream end of the first inductive element is connected to a downstream end of the third inductive element; and wherein the differential output of the filter is taken from the first node and the second node.

25. A trifilar transformer comprising:

a first winding;

a second winding; and a third winding, wherein one of the first, second, and third windings is mutually coupled to each of the other two windings, and wherein said other two windings are substantially not coupled to each other;

wherein the third winding is formed from a first winding part in series with a second winding part, the first winding part having a shape corresponding to the first winding and the second winding part having a shape corresponding to the second winding; and wherein the second winding is concentric or interwound with the first winding;

wherein the first winding and the second winding are stacked in two metal layers.

\* \* \* \* \*